United States Patent [19]

Reinberg et al.

[11] Patent Number: 5,142,438
[45] Date of Patent: Aug. 25, 1992

[54] DRAM CELL HAVING A STACKED CAPACITOR WITH A TANTALUM LOWER PLATE, A TANTALUM OXIDE DIELECTRIC LAYER, AND A SILICIDE BURIED CONTACT

[75] Inventors: Alan R. Reinberg, Westport, Conn.; Mark E. Tuttle, Boise, Id.

[73] Assignee: Micron Technology, Inc., Boise, Id.

[21] Appl. No.: 792,554

[22] Filed: Nov. 15, 1991

[51] Int. Cl.$^5$ .................. H01G 4/06; H01L 21/70; H01L 29/68
[52] U.S. Cl. ................... 361/313; 357/23.6; 357/51; 437/52
[58] Field of Search ............ 437/52; 361/311, 312, 361/313; 357/23.6, 51

[56] References Cited

U.S. PATENT DOCUMENTS

| | | | |
|---|---|---|---|
| 4,432,035 | 2/1984 | Hsieh et al. | 361/313 X |
| 4,971,655 | 11/1990 | Stefano et al. | 156/659.1 |
| 5,012,310 | 4/1991 | Kimura et al. | 357/23.6 |
| 5,053,351 | 10/1991 | Fazan et al. | 437/52 |
| 5,079,670 | 1/1992 | Tigelaar et al. | 357/51 X |

*Primary Examiner*—Donald Griffin
*Attorney, Agent, or Firm*—Angus C. Fox, III

[57] ABSTRACT

An improved DRAM cell having a tantalum metal lower plate, a tantalum-silicide buried contact, and a tantalum oxide capacitor dielectric layer is disclosed. Also disclosed are several methods for fabricating the improved cell. Fabrication of an array of the improved cells proceeds through the storage-node contact opening stage in a manner consistent with the fabrication process utilized for conventional stacked-cell DRAM arrays. The process for fabricating the improved cells deviates from convention after storage-node contact openings are formed. A tantalum metal layer is conformally deposited over the wafer surface, patterned and etched to create individual storage-node plates. The wafer is then subjected to an elevated temperature step in an oxygen ambient, which creates both a tantalum silicide layer at the tantalum-silicon interface of each storage-node contact, and a tantalum oxide dielectric layer on the exposed surfaces of each storage-node plate. The tantalum oxide layer then annealed in order to reduce its leakage current characteristics. Following the annealing step, a thin barrier layer of a material such as silicon nitride is blanket deposited. This is followed by the deposition of a polysilicon cell plate layer.

14 Claims, 2 Drawing Sheets

DRAM CELL HAVING A STACKED CAPACITOR WITH A TANTALUM LOWER PLATE, A TANTALUM OXIDE DIELECTRIC LAYER, AND A SILICIDE BURIED CONTACT

FIELD OF THE INVENTION

This invention relates to semiconductor technology and, more specifically, to the design and manufacture of capacitors used in dynamic random access memory (DRAM) cells. The focus of the invention is a stacked cell capacitor having a tantalum metal lower plate, a tantalum oxide dielectric layer, and a tantalum-silicide buried contact.

BACKGROUND OF THE INVENTION

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Wordlines are generally etched from a doped polysilicon layer. A doped region of silicon substrate functions as the lower (storage-node) capacitor plate, while another doped polysilicon layer generally functions as the upper capacitor plate (cell plate). As component density in planar DRAM chips increased, the shrinkage of cell capacitor size resulted in unacceptably high soft-error rates, lower differential signal strength at column sense amplifiers, and shortened cell refresh times. Although planar capacitors have generally proven adequate for use in DRAM chips up to the one-megabit level, they are considered to be unusable for more advanced DRAM generations.

As a result of the problems associated with the use of planar capacitors for high-density DRAM memories, all manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

Most manufacturers of 4-megabit DRAMS are utilizing stacked capacitor designs. Since both the lower and the upper plates of a typical stacked capacitor are formed from individual conductive layers, the stacked capacitor is generally much less susceptible to soft errors than substrate-based planar and trench designs. By placing the wordline and, in some designs, also the digitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

The electrodes, or plates, of a stacked capacitor are typically patterned from individual layers of conductively-doped polycrystalline silicon (hereinafter also "polysilicon"). There are a number of peculiarities and problems inherent with the use of polysilicon capacitor plates.

Conductively-doped polysilicon layers are generally created by depositing a layer of undoped polysilicon via chemical vapor deposition (CVD), and then doping the deposited layer. The doping step is typically performed by placing a substrate, on which the undoped polysilicon layer has been deposited, in a reactor chamber, introducing phosphine or phosphorus oxychloride and oxygen gases into the chamber at a temperature sufficient to cause the formation of a $P_2O_5$ and $SiO_2$ glaze layer on the polysilicon surface. When the thickness of the glaze layer has reached 200–500Å, the phosphine or phosphorus oxychloride and oxygen gases are shut off, the temperature of the reactor chamber is either maintained or increased, and nitrogen gas is introduced into the chamber. This condition is maintained until the desired amount of phosphorus has diffused from the glaze layer into the polysilicon layer. One of the problems with this method of doping is that the undoped polysilicon layer must be thicker than the thickness desired for the DRAM capacitor plates, as some polysilicon is consumed during the in situ doping process. A thickness of 600Å is considered a realistic minimum value for initial undoped layers. As cell geometries are shrunk, thicknesses of such magnitude may pose a problem for doping vertically-oriented portions of the layer which occur, for example, in interwordline gap regions. The steps required for doped polysilicon layer formation also represent a manufacturing cost.

Another problem related to the use of a conductively-doped polysilicon layer for the bottom plate of a DRAM capacitor is that the dopant impurities from the polysilicon layer tend to diffuse into the channel of the cell access transistor. This problem becomes more acute as cell geometries are shrunk, resulting in shorter channel lengths and thinner gate sidewall spacers.

Yet another disadvantage related to the use of conductively-doped polysilicon layers for DRAM capacitor plates is the fact that the native oxide ($SiO_2$) must be utilized as at least a component of the cell dielectric layer. Most contemporary DRAM cells use an oxide-nitride-oxide (ONO) dielectric layer. The problem with $SiO_2$ is that it has a relatively low dielectric constant, which negatively impacts cell capacitance. In addition, direct tunneling current greatly increases below an effective $SiO_2$ film thickness of 4 nm. In order to further miniaturize DRAM memories, it will be necessary to decrease the operating voltage from 3.3 V to 1.5 V. Since $Q=CV$, where Q is the stored charge, C is the capacitance, and V is the voltage, if the voltage is lowered, the capacitance must be raised to maintain a constant charge.

Tantalum pentoxide, on account of its relatively high dielectric constant, has received considerable attention as a potential replacement for the ONO dielectric layers that are currently the norm for contemporary DRAM's. Since the dielectric constant of tantalum pentoxide is approximately 20 (vs. 8 for a typical ONO dielectric), greater charge may be stored within a cell capacitor for a given dielectric thickness. Until recently, however, the high leakage currents normally associated with tantalum pentoxide films have precluded their use as DRAM cell dielectrics. Hitachi Corp. has developed a new two-step process for annealing tantalum pentoxide films deposited via low-pressure chemical vapor deposition so as to reduce leakage current to levels that are compatible with DRAM cell dielectrics. The first step, called UV-O$_3$ annealing, involves subjecting the tantalum pentoxide film to an ozone (9-percent by volume)-/oxygen mixture irradiated by ultraviolet light provided by a mercury lamp. The second step is performed at 800° C. in a dry oxygen ambient and is called dry-O$_2$ annealing.

What is needed is a DRAM cell which eliminates the problems associated with polysilicon lower capacitor plates, and which combines a tantalum pentoxide cell dielectric layer for increased cell capacitance.

SUMMARY OF THE INVENTION

Disclosed herein is an improved DRAM cell having a tantalum metal lower plate, a tantalum-silicide buried contact, and a tantalum oxide capacitor dielectric layer. Also disclosed are several methods for fabricating the improved cell.

Fabrication of an array of the improved cells proceeds through the storage-node contact opening stage in a manner consistent with the fabrication process utilized for conventional stacked-cell DRAM arrays. That is to say that field oxide regions have been created on a silicon wafer substrate, access transistor gate and interconnect structures have been patterned from a polysilicon layer that is covered, first, with a refractory metal silicide layer and then with a dielectric layer, sidewall spacers have been created with an anisotropic etch on gate and interconnect structures, transistor source/drain regions have been created via one or more implantation steps, and self-aligned storage-node contact openings have been created with a masked anisotropic etch. The process for fabricating the improved cells deviates from convention at this point. A tantalum metal layer is conformally deposited over the wafer surface such that the tantalum layer is in intimate contact with the storage-node contact openings. The tantalum layer is then patterned with a mask and etched to create individual storage-node plates. The wafer is then subjected to an elevated temperature step in an oxygen ambient, which creates both a tantalum silicide layer at the tantalum-silicon interface of each storage-node contact, and a tantalum oxide (primarily Ta$_2$O$_5$) dielectric layer on the exposed surfaces of each storage-node plate. The tantalum oxide layer is then annealed in order to reduce its leakage current characteristics. Following the annealing step, a thin barrier layer of a material such as silicon nitride is blanket deposited. This is followed by the deposition of a polysilicon cell plate layer. The polysilicon layer is then doped, patterned and etched such that it covers only array portions of each memory chip on the wafer. The array and peripheral circuitry is then completed using techniques well-known in the art.

PREFERRED EMBODIMENT OF THE INVENTION

Figure 1:
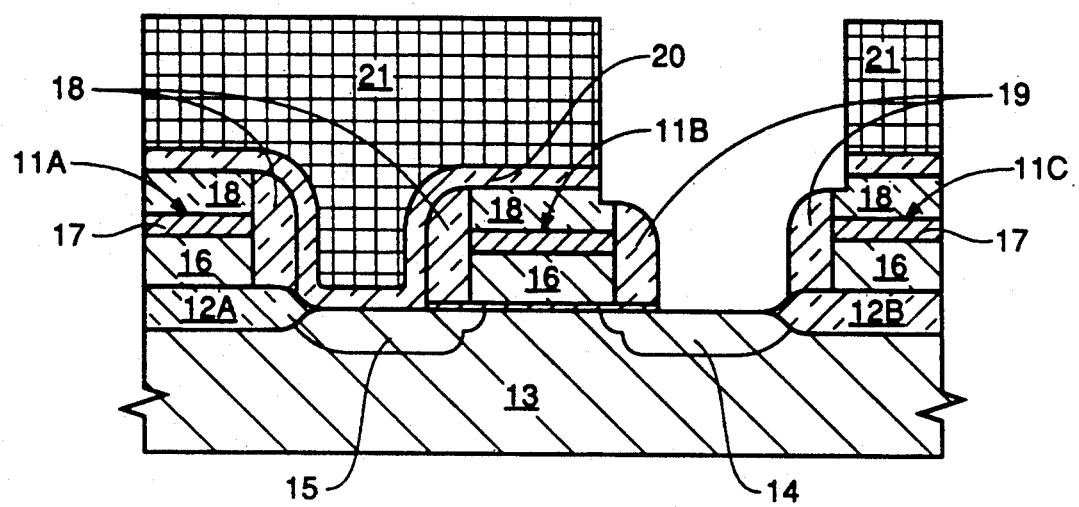
FIG. 1 is a cross-sectional view of an in-process DRAM array at the stage where a storage node contact for each cell has been masked and exposed with a self-aligned etch.

Referring now to FIG. 1, a small portion of an in-process dynamic random access memory (DRAM) array of stacked capacitor design is depicted at the cell capacitor fabrication stage. Three wordlines 11A, 11B, and 11C are depicted in this cross-sectional view. In the portion of the array that is depicted, wordlines 11A and 11C are traversing field oxide regions 12A and 12B respectively. Wordline 11B, on the other hand, is traversing an active area of a substrate 13, thus forming an access transistor in combination with storage-node junction 14 and access-node junction 15. Each wordline 11 consists of a conductively-doped polysilicon layer 16, a refractory metal silicide layer 17, which lowers the sheet resistance of polysilicon layer 16. Each wordline 11 is covered on its upper surface by a dielectric capping layer 18 that is preferably silicon dioxide, and on its sides by dielectric spacers 19 that are also preferably silicon dioxide. Also visible in this view is a silicon dioxide substrate isolation layer 20, which serves to isolate charge storage layers from certain active areas. A bitline, which is not visible in this cross-sectional view, since it runs perpendicular to the wordlines, will make contact to access-node junction 14. The storage-node plate of the cell capacitor will make contact with the storage-node junction 13. So that the storage-node plate of each cell will make contact with its respective storage-node junction, a storage-node contact mask 21 exposes an area of each cell superjacent its storage-node junction 13. In the instant case, an oxide etch (either wet or plasma) is then used to remove a portion of isolation layer 20 that is exposed by storage-node contact mask 21.

Figure 2:
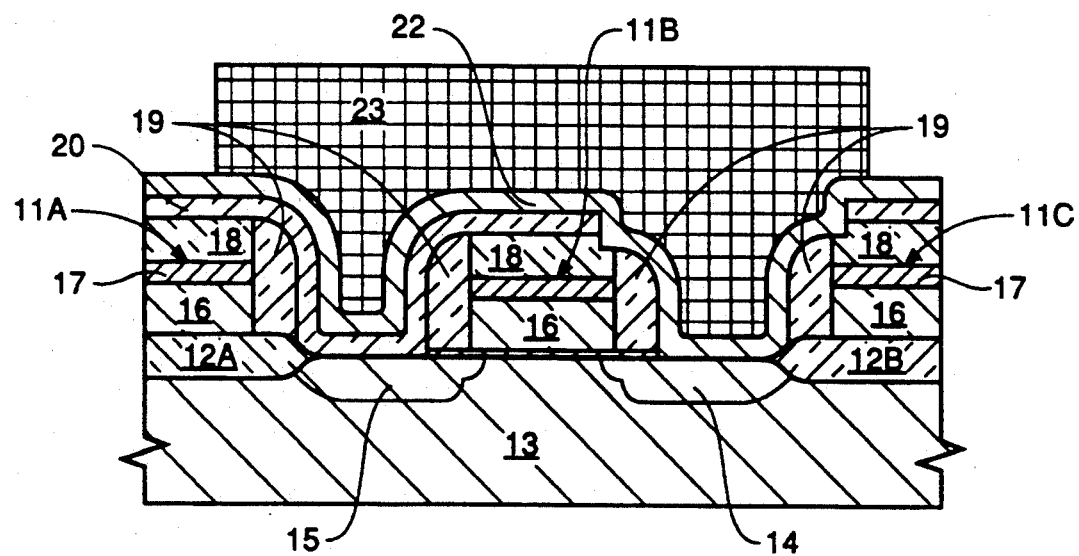
FIG. 2 is a cross-sectional view of the in-process DRAM array of FIG. 1 following deposition and patterning of a tantalum storage-node plate layer.

Referring now to FIG. 2, a tantalum metal layer 22 is conformally deposited over the wafer surface such that tantalum layer 22 is in intimate contact with the storage-node contact junction 13. As a capacitance-enhancing factor, tantalum layer 22 may be of the porous variety known to manufacturers of discrete tantalum capacitors. Tantalum layer 22 is then patterned with a storage-node plate photomask 23.

Figure 3:
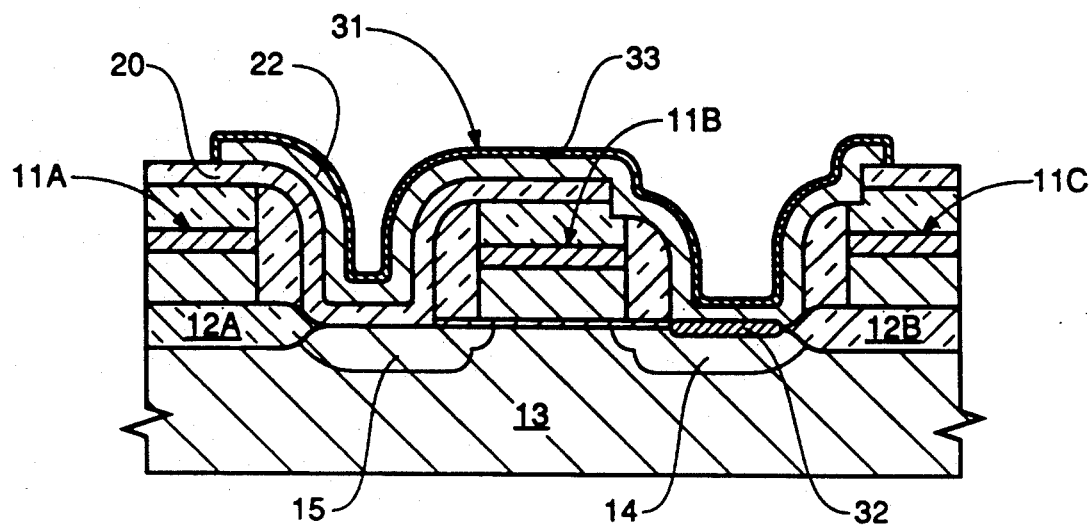
FIG. 3 is a cross-sectional view of the in-process DRAM array of FIG. 2 following an etch of the tantalum storage-node plate layer, and a subsequent elevated temperature step in an oxygen ambient.

Referring now to FIG. 3, tantalum layer 22 has been etched to create individual storage-node plates 31, and photomask 23 has been stripped. The wafer is then subjected to a rapid thermal processing (RTP) or furnace heating temperature step in an oxygen ambient, which creates both a tantalum silicide layer 32 at the tantalum-silicon interface of each storage-node contact, and a tantalum oxide (primarily Ta$_2$O$_5$) dielectric layer 33 on the exposed surfaces of each storage-node plate 23. Alternatively, tantalum silicide layer 32 may be created in an anaerobic ambient using RTP or furnace heating, with the tantalum oxide dielectric layer 33 being formed in a subsequent step by one of several known processes such as wet chemistry, plasma oxidation, or anodic oxidation. Tantalum oxide layer 33 is, then, optionally annealed in order to reduce its leakage current characteristics.

Figure 4:
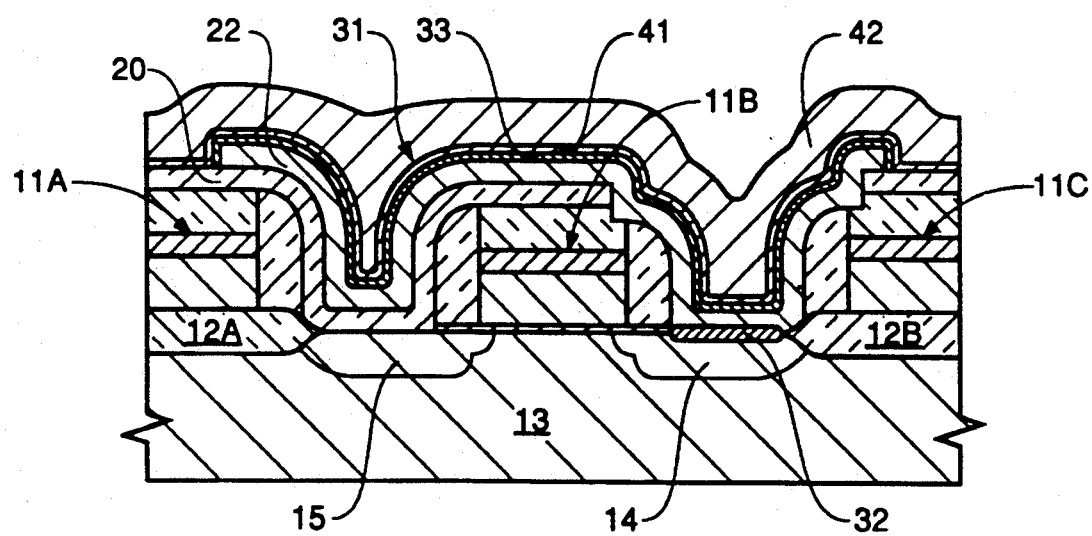
FIG. 4 is a cross-sectional view of the in-process DRAM array of FIG. 3 following deposition of a barrier layer, and the subsequent deposition of a polysilicon cell plate layer.

Referring now to FIG. 4, a thin barrier layer 41, of a material such as silicon nitride, is blanket deposited. Barrier layer 41 will prevent undesirable interactions between tantalum oxide layer 33 and the polysilicon cell plate layer that will be subsequently deposited. The deposition of barrier layer 41 is followed by the deposition of a polycrystalline silicon (polysilicon) cell plate layer 42. Polysilicon cell plate layer 42 is then patterned and etched such that it covers only array portions of each memory chip on the wafer. The array and peripheral circuitry is then completed using techniques well-known in the art.

Although only several embodiments of the improved DRAM cell capacitor are disclosed herein, it will be evident to those having ordinary skill in the art of semiconductor fabrication that changes and modifications may be made thereto without departing from the scope and spirit of the invention as claimed.

We claim:

1. An improved stacked capacitor for a dynamic random access memory cell, said memory cell being of the type that is fabricated on a silicon substrate of a first conductivity type, and having storage-node junction and access-node junction diffusion regions of a second conductivity within said substrate, said diffusion regions being interconnected by the channel of a cell access transistor, said capacitor comprising:
   (a) a tantalum metal storage-node plate in electrical communication with said storage-node junction;
   (b) a tantalum silicide layer interposed between said storage-node plate and said storage-node junction;
   (c) a cell plate layer; and
   (d) a tantalum oxide dielectric layer which is interposed between said cell plate layer and said storage-node plate.

2. The improved stacked capacitor of claim 1, wherein said cell plate layer is polycrystalline silicon.

3. The improved stacked capacitor of claim 2, which further comprises a barrier layer interposed between said tantalum oxide dielectric layer and said polycrystalline silicon cell plate layer.

4. The improved stacked capacitor of claim 3, wherein said tantalum oxide dielectric layer contains primarily $Ta_2O_5$.

5. The improved stacked capacitor of claim 4, wherein said barrier layer is silicon nitride.

6. The improved stacked capacitor of claim 4, wherein said barrier is of a thickness within a range of 5–30Å.

7. The improved stacked capacitor of claim 4, wherein said tantalum oxide dielectric layer has been annealed to improve leakage current characteristics.

8. A stacked capacitor for a dynamic random access cell which is charged and discharged through a conductively-doped silicon storage-node junction, said capacitor comprising:
   (a) a tantalum metal storage-node plate in electrical communication with said storage-node junction;
   (b) a tantalum silicide layer interposed between said storage-node plate and said storage-node junction;
   (c) a cell plate layer; and
   (d) a tantalum oxide dielectric layer which is interposed between said cell plate layer and said storage-node plate.

9. The improved stacked capacitor of claim 8, wherein said cell plate layer is polycrystalline silicon.

10. The improved stacked capacitor of claim 9, which further comprises a barrier layer interposed between said tantalum oxide dielectric layer and said polycrystalline silicon cell plate layer.

11. The improved stacked capacitor of claim 10, wherein said tantalum oxide dielectric layer contains primarily $Ta_2O_5$.

12. The improved stacked capacitor of claim 11, wherein said barrier layer is silicon nitride.

13. The improved stacked capacitor of claim 11, wherein said barrier is of a thickness within a range of 5–30Å.

14. The improved stacked capacitor of claim 11, wherein said tantalum oxide dielectric has been annealed to improve leakage current characteristics.

* * * * *

UNITED STATES PATENT AND TRADEMARK OFFICE
CERTIFICATE OF CORRECTION

PATENT NO. : 5,142,438
DATED : August 25, 1992
INVENTOR(S) : Alan R. Reinberg et al.

It is certified that error appears in the above-indentified patent and that said Letters Patent is hereby corrected as shown below:

Column 3, line 15, delete "$O_z$" and insert -- $O_2$ --.

Signed and Sealed this

Fifteenth Day of February, 1994

BRUCE LEHMAN

Attest:

Attesting Officer

Commissioner of Patents and Trademarks